ANTIREFLECTIVE COATINGS FOR SOLAR CELLS

Filed Oct. 13, 1965

WITNESSES
Robert C. Baird
James T. Young

INVENTORS
Krishan S. Tarneja
and William R. Harding, Jr.
BY
C. L. Menzemer
ATTORNEY United States Patent Office 3,533,850
Patented Oct. 13, 1970

3,533,850

ANTIREFLECTIVE COATINGS FOR SOLAR CELLS

Krishan S. Tarneja, Pittsburgh, and William R. Harding, Jr., Jeannette, Pa., assignors to Westinghouse Electric Corporation, Pittsburgh, Pa., a corporation of Pennsylvania Filed Oct. 13, 1965, Ser. No. 495,509
Int. Cl. H01l 15/02
U.S. Cl. 136—89 6 Claims

ABSTRACT OF THE DISCLOSURE

An antireflective coating consisting of a material selected from the group consisting of titanium dioxide, tantalum, oxide, cerium oxide, zinc sulphide, and tin oxide is deposted on the surface of the shallow region of semiconductivity of a solar cell. A quartz cover is cemented to the antireflective coating and the electrical contact of the shallow region. The combination of a quartz cover and the antireflective coating provides for a more efficient solar cell.

This invention relates to solar cells and more particularly to an antireflective coating for such cells.

A solar cell or photovoltaic cell is comprised of a body of semiconductor material having two regions of opposite type semiconductivity with a p-n junction therebetween. The p-n junction is usually about one-half a micron below the surface of one face of the body of semiconductor material. Thus the cell has a shallow region and a thicker region. Each region has a major surface. The two major surfaces are parallel to each other.

Radiant energy usually in the form of light falling on the major surface of the shallow region is absorbed rapidly as it penetrates the semiconductor material. Part of this absorbed radiant energy disrupts covalent atomic bonds in the crystal structure of the body, producing electrons and holes in pairs. The minority carriers of the hole-electron pairs in the region of their generation either recombine with majority carriers or cross the p-n junction. The carriers which go across the p-n junction cause the body to become biased, with the p-type region positive and the n-type region negative. The bias results in useful electrical current which flows when the two regions are connected externally by an electrical conductor.

An electrical grid contact is disposed on the major surface of the shallow region, to permit the radiant energy to strike the surface itself, and a solder layer is usually employed as the electrical contact on the other major surface.

When the solar cell is to be used for space applications a protective quartz cover is disposed over the surface having the grid contact. The quartz cover is usually cemented to the surface.

In space applications, one of the most important considerations in the design of a solar cell is the efficiency of the cell (i.e., power output-to-weight ratio). One way to achieve greater efficiency is to apply a thin coating to the surface of the solar cell upon which the grid contact is disposed prior to application of the quartz cover. Such a coating operates in two ways to improve efficiency.

First, it improves absorption of light over the range of wavelengths useful for power conversion by reducing the reflection coefficient.

Secondly, the coating absorbs and reradiates or reflects incident photons in the non-useful wavelength range, thus preventing them from heating the cell and reducing the open-circuit voltage.

In this latter respect, light having a wavelength in the range of about 0.5–0.75 micron is useful in generating a potential across the p-n junction of the cell. The remaining wavelengths act only to heat the cell and reduce its operating efficiency inasmuch as the cell open-circuit voltage decreases with the increasing temperature. It has been the practice in the past to dispose a coating of silicon dioxide on the grid surface to improve the efficiency of the device.

However, silicon dioxide is not a satisfactory coating for a solar cell when it is necessary to dispose a quartz cover too on the surface of the cell which is exposed to radiant energy.

An object of the present invention is to provide a coating for a solar cell which when used in conjunction with a quartz cover improves the efficiency of the solar cell.

Another object of the present invention is to provide a solar cell having a coating consisting of at least one material selected from the group consisting of titanium dioxide, tantalum oxide, cerium oxide, zinc sulphide and tin oxide disposed upon that surface which is exposed to radiant energy and a quartz cover disposed over said coating.

Other objects will, in part, be obvious, and will, in part, appear hereinafter.

The present invention and attainment of the foregoing objects and advantages thereof may best be understood by reference to the following detailed description and drawings in which.

In accordance with the present invention and attainment of the foregoing objects there is provided a solar cell comprising a body of a semiconductor material, said body having two opposed major parallel surfaces, said body having two regions of opposite type semiconductivity, a p-n junction between the two regions, each of said regions extending in an opposite direction from the p-n junction to one of the major surfaces, one of said regions being shallow relative to the other region, a coating consisting of at least one material selected from the group consisting of titanium dioxide, tantalum oxide, cerium oxide, zinc sulphide and tin oxide disposed upon the major surface of the shallow region, and a quartz cover disposed over said coating.

Figure 1:
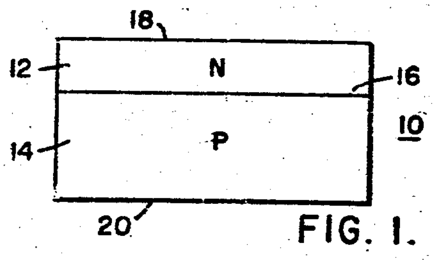
FIG. 1 is a side view, in cross-section of a body of semiconductor material suitable for use in accordance with the teachings of this invention.

With reference to FIG. 1, there is shown a body 10 of a semiconductor material. The body 10 may be of silicon, germanium, silicon carbide or it may be a III–V or II–VI compound such for example gallium arsenide or cadmium sulfide.

The body 10 has a region 12 of a first type of semiconductivity, for example n-type semiconductivity, a region 14 of an opposite type of semiconductivity for example, p-type semiconductivity and a p-n junction 16 disposed between the regions 12 and 14.

The body 10 has oppositely opposed parallel major surfaces 18 and 20 respectively.

As is typical in solar cells the n-type region 12 is shallow or narrow compared to the p-type region 14; for example, in typical devices the region 12 will have a depth of about 0.5 micron and the region 14 has a depth of about 15 mils.

Figure 2:
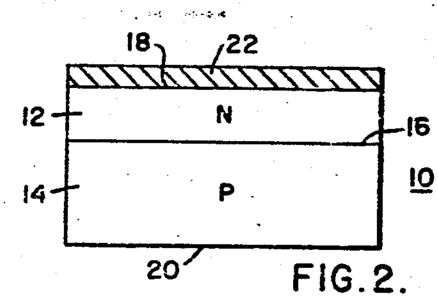
FIG. 2. PRIOR ART
FIGS. 2 and 3 are side views in cross-section of the body of FIG. 1 undergoing processing in accordance with the prior art teachings.

With reference to FIG. 2, there is shown the body 10 after a layer 22 of an antireflective coating has been applied.

Assume initially that the layer 22 of an antireflective coating material is, as has been used in the past silicon dioxide.

It has been shown from theoretical considerations involving interference in non-reflective coatings that in order to have destructive inteference for an incident light beam on such a layer 22 (normal incidence being assumed), the thickness of the coating should be equal to one-quarter wavelength of the desired wavelength.

As mentioned above, the desired wavelength of the light used to activate the solar cell is in the range of 0.5 to 0.75 micron, and preferably about 0.63 micron. Consequently, the thickness of the layer 22 should be in the range of about 0.12 to 0.19 micron, and preferably about 0.16 micron.

However, in order to meet the required conditions for destructive inteference at the desired wavelength, a specified relationship between the index of refraction above the layer 22 and the index of refraction of the silicon or other semiconductor material comprising the body 10 must be met. For purposes of this explanation the body 10 will be considered to be comprised of silicon. Then let R be the refractive index of the layer 22; $N_1$ be the refractive index of the silicon; and $N_2$ be the refractive index of the surface above the coating (i.e., air). Then, the relationship between R and $N_1$, $N_2$ is given by $$R=\sqrt{N_1N_2}$$

In the case of FIG. 2, where only the layer 22 is applied to the body 10, $N_1$ will be equal to 3.6 (the refractive index for silicon) and $N_2$ will be equal to 1 (the refractive index for air). Thus:

$$R=\sqrt{N_1N_2}=\sqrt{3.6}=1.9$$

In this case, silicon dioxide, which has a refractive index of about 1.9, can be used satisfactorily.

Figure 3:
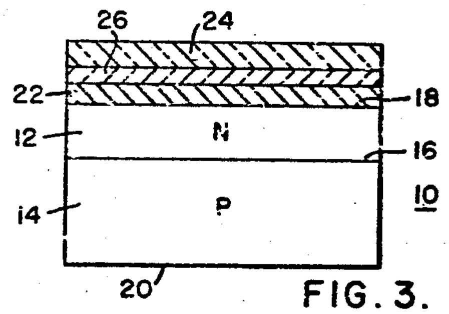
FIG. 3. PRIOR ART

With reference to FIG. 3 this condition, however, does not continue to exist when, as required in space applications a transparent quartz cover 24 is placed over the layer 22. The quartz cover 24 is secured to the layer 22 of silicon dioxide by a layer 26 of a transparent cement.

A suitable transparent cement is one having a refractive index of 1.5 and is transparent as for example that sold by Furane Plastics, Inc. under the trade name EPI Bond-Transparent-ISE and which is commonly used in applying quartz covers to solar cells.

Now, $N_1$ will be equal to 3.6, the refractive index of silicon, and $N_2$ will be 1.5, the refractive index of the transparent cement.

Then the refractive index (R) for the layer 22 of coating will be equal to:

$$R=\sqrt{N_1N_2}=\sqrt{3.6\times 1.5}=2.32$$

From this it becomes apparent that silicon dioxide is no longer effective as a coating and if a solar cell is to be prepared having both a coating so that all wavelengths other than the desired wavelength of 0.5 to 0.75 micron is reflected and a quartz cover having a refractive index of 2.32 or more generally a refractive index of from 2.0 to 2.5 must be used.

The surprising discovery has now been made that a coating consisting of at least one material selected from the group consisting of titanium dioxide, tantalum oxide, cerium oxide, zinc sulphide and tin oxide provides the necessary refractive index and does not otherwise adversely affect the operation of the solar cell. Titanium dioxide is the preferred material.

Figure 4:
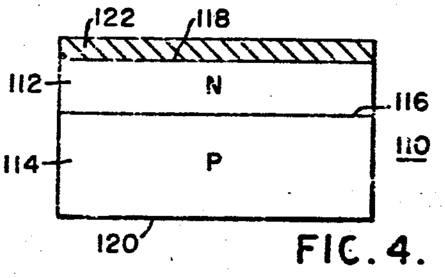

With reference to FIG. 4 there is shown a body 110 of semiconductor material which has been processed in accordance with the teachings of this invention.

The body 110 of semiconductor material assume it to be silicon for purposes of this explanation, has a region 112 of a first-type of semi-conductivity, for example n-type semiconductivity, and a region 114 of opposite or p-type semiconductivity. This is a p-n junction 116 between the two regions.

The body 110 has two oppositely opposed parallel major surfaces 118 and 120.

As pointed out hereinabove and as is typical in solar cells the n-type region 112 is shallow or narrow compared to region 114. In a typical solar cell region 112 will have depth of about 0.5 micron and the region 114 a depth of about 15 mils.

A layer 122 of a coating consisting of at least one material selected from the group consisting of titanium dioxide, tantalum oxide, cerium oxide, zinc sulphide and tin oxide is disposed on a surface 118 of the body 110.

The layer 122 has a thickness of from about 0.12 to 0.19 micron and preferably about 0.16 micron. The coating should have a thickness of about one-quarter wavelength of light energy having a wavelength in the range of about 0.5 to 0.75 micron.

The layer 122 of the coating may be produced, for example, by evaporating titanium dioxide, tantalum oxide, cerium oxide, zinc sulphide or tin oxide directly onto the diffused surface of the cell. Alternatively, in the case of the oxides, the elemental metal may be initially evaporated, followed by heating in an oxidizing atmosphere.

Figure 5:
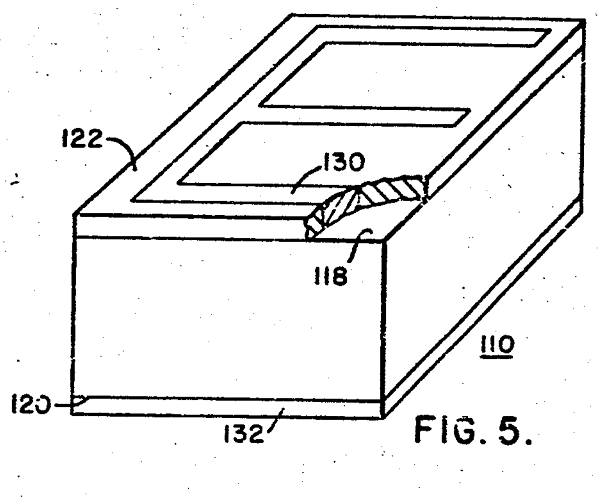
FIGS. 4 and 5 are side views in cross-section of the body of FIG. 1 undergoing processing in accordance with the teachings of this invention.

With reference to FIG. 5, in actually preparing a commercial solar cell, after the layer 122 of coating has been applied over surface 118 of the region 112 a grid pattern is etched into the layer 122 of coating using conventional photoresist techniques and an electrical metal contact 130 in grid form is affixed to surface 118 of region 112.

The electrical contact, preferably silver can be deposited on surface 118 by evaporation then sintered or by any other process known to those skilled in the art.

An electrical contact 132 is disposed on surface 120 of the body 110 by dip soldering or any other process known to those skilled in the art.

Alternatively, the contact 130 can be evaporated and sintered as in the normal procedure, and the sample then coated with the desired oxide or sulphide coating, as the case may be. In this latter case, however, the coating step must be carried out at lower temperatures, below the melting point of the metal comprising the contact. This, of course, requires a longer period of time in order to produce the desired coating thickness. After the coating has been applied, it is then removed from the grid pattern only using photo-resist techniques, and the sample is thereafter dip soldered to produce the lower contact 132.

Figure 6:
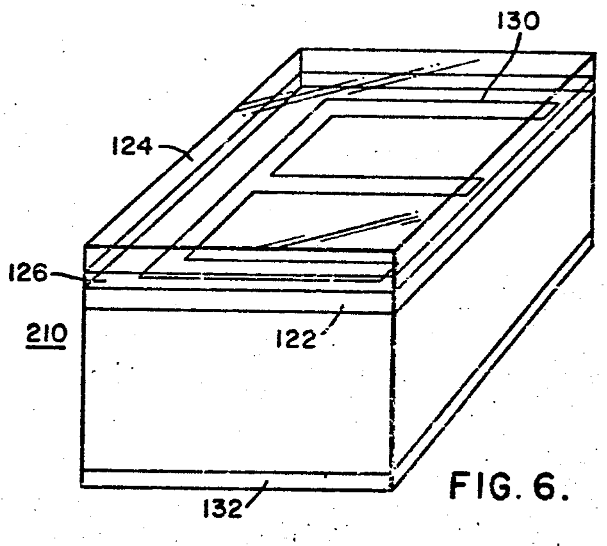
FIG. 6 is a perspective view, partially in cross-section of a solar cell prepared in accordance with the teachings of this invention.

With reference to FIG. 6, after the affixing of the contacts 130 and 132 a transparent quartz cover 124 is placed over the layer 122. The quartz cover 124 is secured to the layer 122 by a layer 126 of a transparent cement having a refractive index of 1.5.

Body 210 of FIG. 6 is a completed solar cell.

A series of solar cells were prepared from silicon and tested for short circuit current through the cells without a load. The solar cells were identical except some were tested without anti-reflective coatings and without quartz covers, others were tested with an anti-reflective coating but without quartz covers, others with a quartz cover but no coating and others with both anti-reflective coatings and quartz covers the results are set forth below in table form.

TABLE I

| | Coating | Quartz cover | Short circuit current, ma./cm.² |
|---|---|---|---|
| Batch No.: | | | |
| 1 | None | None | 22.0 |
| 1 | $TiO_2$ | do | 25.9 |
| 1 | None | Yes | 26.4 |
| 1 | $TiO_2$ | Yes | 29.1 |
| 2 | None | None | 23.7 |
| 2 | $TiO_2$ | do | 26.9 |
| 2 | None | Yes | 28.2 |
| 2 | $TiO_2$ | Yes | 29.5 |

Note that in the case of Batch 1, for example, 22 milliamperes per square centimeter are developed under no load conditions and without an anti-reflective coating, whereas 25.9 milliamperes per square centimeter are developed after the titanium dioxide coating is applied, but without the quartz plate. When the quartz plate only is applied, without the titanium dioxide coating, 26.4 milliamperes per square centimeter are developed; whereas with the combination of the titanium dioxide coating and the quartz plate, 29.1 milliamperes per square centimeter results. Comparable results were obtained from the cells of Batch 2.

Similar results are obtained when the anti-reflective coating is selected from tantalum oxide, cerium oxide, zinc sulphide or tin oxide, the current density with the coating and quartz plate being in the range of about 1.2 to 1.5 times that achieved without any coating and without the quartz plate.

The efficiency of the cells measured by the ratio of power output to power input was also determined.

This data is set forth in table form below.

TABLE II

| | Coating | Quartz cover | Percent efficiency |
|---|---|---|---|
| Batch: | | | |
| 1 | None | None | 8.3 |
| 1 | $TiO_2$ | do | 10.5 |
| 1 | None | Yes | 9.85 |
| 1 | $TiO_2$ | Yes | 11.0 |
| 2 | None | None | 9.5 |
| 2 | $TiO_2$ | do | 10.85 |
| 2 | None | Yes | 11.0 |
| 2 | $TiO_2$ | Yes | 11.8 |

In the foregoing Tables I and II, readings were taken after the cell was illuminated under simulated sunlight (i.e., 100 milliwatts/cm.$^2$) for five minutes in order to afford sufficient time for any heating effects to develop.

In each case it should be noted that the properties of the solar cell was improved by applying an anti-reflective coating consisting of a material selected from the group consisting of titanium dioxide, tantalum oxide, cerium oxide, zinc sulphide and tin oxide and a quartz cover.

In contrast, a cell was prepared from Batch 1 using silicon dioxide as the anti-reflective coating. When tested under identical conditions as the cells reported in Tables I and II, the cell had a short circuit current without load and efficiency approximately equal to a cell with titanium dioxide as the reflective coating. However, when the quartz cover was disposed over the $SiO_2$ the short circuit current load and the efficiency decreased about 5% rather than increasing as in the case of the cells with $TiO_2$ as the anti-reflective layer.

Although the invention has been shown in connection with certain specific embodiments, it will be readily apparent to those skilled in the art that various changes may be made to suit requirements without departing from the spirit and scope of the invention.

We claim:

1. A solar cell comprising a body of semiconductor material, said body having two opposed major parallel surfaces, said body having two regions of opposite type semiconductivity, a p-n junction between the two regions, each of said regions extending in an opposite direction from the p-n junction to one of the major surfaces, one of said regions being shallow relative to the other region, an antireflective coating consisting of a single layer of at least one material selected from the group consisting of titanium dioxide, tantalum oxide, cerium oxide, zinc sulphide and tin oxide disposed upon the major surface of the shallow region, and a quartz cover disposed on said coating.

2. The solar cell of claim 1 wherein the semiconductor material is silicon.

3. A solar cell comprising a body of silicon semiconductor material, said body having two opposed major parallel surfaces, said body having two regions of opposite each of said regions extending in an opposite direction from the p-n junction to one of the major surposite type semiconductivity, a p-n junction between the two regions, each of said regions extending in an opposite direction from the p-n junction to one of the major surfaces, one of said regions being shallow relative to the other region, an anti-reflective coating of a single layer of titanium dioxide disposed upon the major surface of the shallow region, and a quartz cover disposed on said coating.

4. The solar cell of claim 3 wherein the coating of titanium dioxide has a thickness of from 0.12 to 0.19 micron.

5. The solar cell of claim 3 wherein the coating of titanium dioxide has a thickness equal to about one-quarter wavelength of light energy having a wavelength in the range of about 0.5 to 0.75 micron.

6. A solar cell comprising a body of silicon, said body having two opposed major parallel surfaces, said body having two regions of opposite type semiconductivity, a p-n junction between the two regions, each of said regions extending in an opposite direction from the p-n junction to one of the major surfaces, one of said regions being shallow relative to the other region, an anti-reflective coating of a single layer of titanium dioxide disposed upon the major surface of the shallow region, said coating having a thickness of from about 0.12 to 0.19 micron, a quartz cover disposed over said coating, and a layer of a transparent adhesive cement having an index of refraction of about 1.5 disposed between said quartz cover and said coating and joining one to the other.

References Cited

UNITED STATES PATENTS

| | | | |
|---|---|---|---|
| 2,552,184 | 5/1951 | Koch | 350—166 X |
| 3,049,622 | 8/1962 | Ahlstrom et al. | 136—89 |
| 3,076,861 | 2/1963 | Samulon et al. | 136—89 |
| 3,186,874 | 6/1965 | Gorski | 136—89 |
| 3,361,594 | 1/1968 | Iles et al. | 136—89 |

OTHER REFERENCES

J. T. Cox, et al.: "Infrared Filters," J. Opt., Soc. Am., vol. 51, pp. 714–718, July 1961.

E. L. Ralph, et al.: IEEE, vol. 12, No. 9, pp. 493–496, September, 1965.

O. S. Heavens: Optical Properties of Thin Solid Films, London, Butterworth Sci. Pub., pp. 207–210, pp. 215–217, 1955.

A. Thelen: Prog in Astronautics and Rocketry, vol. 3, pp. 373–383, July, 1961.

J. H. Martin, et al.: Pr. 17th Ann., Power Sources Conf., pp. 15–19, February, 1964.

F. J. Campbell: Proceedings 17th Ann. Power Sources Conf., pp. 19–22, February, 1964.

WINSTON A. DOUGLAS, Primary Examiner

M. J. ANDREWS, Assistant Examiner